(12) United States Patent
Miller et al.

(10) Patent No.: US 10,551,611 B2
(45) Date of Patent: Feb. 4, 2020

(54) TECHNIQUES FOR REMOVING PARTICULATE FROM AN OPTICAL SURFACE

(71) Applicant: Microsoft Technology Licensing, LLC, Redmond, WA (US)

(72) Inventors: Joshua Owen Miller, Woodinville, WA (US); Utku Baran, Seattle, WA (US); Wyatt Owen Davis, Bothell, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 17 days.

(21) Appl. No.: 15/956,327

(22) Filed: Apr. 18, 2018

(65) Prior Publication Data

US 2019/0324262 A1 Oct. 24, 2019

(51) Int. Cl.
G02B 26/08 (2006.01)
B81B 3/00 (2006.01)
B81B 7/02 (2006.01)

(52) U.S. Cl.
CPC ........ *G02B 26/0833* (2013.01); *B81B 3/0083* (2013.01); *B81B 7/02* (2013.01); *B81B 2201/042* (2013.01); *B81B 2207/03* (2013.01)

(58) Field of Classification Search
CPC .... G02B 26/005; G02B 26/02; G02B 26/004; G02B 26/007; G02B 26/023
USPC ........................................................ 359/290
See application file for complete search history.

(56) References Cited

U.S. PATENT DOCUMENTS

| | | | |
|---|---|---|---|
| 6,076,216 A | 6/2000 | Biryukov | |
| 6,636,653 B2* | 10/2003 | Miracky | G02B 6/1245 359/248 |
| 7,724,299 B2 | 5/2010 | Kawai | |
| 9,571,709 B2 | 2/2017 | Ifuku et al. | |
| 2003/0122206 A1 | 7/2003 | Bhattarai et al. | |
| 2007/0023851 A1* | 2/2007 | Hartzell | B81C 1/00246 257/414 |

(Continued)

FOREIGN PATENT DOCUMENTS

WO 2010109261 A1 9/2010

OTHER PUBLICATIONS

Hou, et al., "Experrmental Study of Particle Removal With PLZT Induced Voltages", In Proceedings of Symposium on Piezoelectricity, Acoustic Waves, and Device Applications, Oct. 30, 2014, pp. 80-85.

*Primary Examiner* — Mohammed A Hasan
(74) *Attorney, Agent, or Firm* — Arent Fox LLP

(57) ABSTRACT

The present disclosure generally relates to a method, and apparatus implementing the method for removing particulate accumulation from an optical element of a micro electromechanical systems (MEMS) package. The method may select a cleaning mode based, at least in part on, one or more of output of a sensor or a maintenance routine. Cleaning modes may include actuating, using an actuator of the MEMS package, one of a plurality of motion modes across the optical element. Optionally, the cleaning mode may include applying, using a power source of the MEMS package, a charge to the optical element. The disclosed techniques may enable the MEMS package to automatically and dynamically remove particulate matter without introducing additional mechanical elements.

20 Claims, 9 Drawing Sheets

(56) References Cited

U.S. PATENT DOCUMENTS

2013/0311108 A1\* 11/2013 Stetter .................... G01N 27/00
                                                                                                                     702/22
2015/0334277 A1   11/2015 Liu et al.
2017/0160542 A1    6/2017 Mouri et al.

\* cited by examiner

TECHNIQUES FOR REMOVING PARTICULATE FROM AN OPTICAL SURFACE

BACKGROUND

Implementations of the present disclosure relate generally to micro-electromechanical systems (MEMS) having an optical element, and more particularly, to apparatus and methods for removing particulate buildup from an optical elements associated with the MEMS.

Micro-electromechanical systems (MEMS) are silicon chips including both electronic circuits and mechanical devices. MEMS techniques enable the construction of chips (e.g., sensor chips) with built-in electronics that are a fraction of the size of conventional integrated circuits. Example of MEMS devices include pressure sensors, accelerometers, inkjet nozzles, and mirror chips, and other miniature mechanical structures having electrical circuitry fabricated with the device. MEMS devices may be constructed using a variety of techniques, many of which are derived from integrated circuit fabrication methods. The integrated nature of MEMS devices may enable the rapid, large-scale fabrication of microelectromechanical optical elements, such as mirrors and mirror arrays.

MEMS mirrors and mirror arrays may be constructed to include small magnets that produce a magnetic field, and a coil surrounding the mirror, through which electrical current flows. The flow of electrical current through the coil results in a Lorentz force which serves as an actuator and drives the mirror. Over time, the flow of electrical current around the mirror, and exposure to the environment during the standard use, may cause an accumulation of dust or particulate matter. Such particulate may substantially occlude the mirror surface and/or impair accurate positioning of the MEMS mirror or mirror array, due to the small size of MEMS.

Techniques for removing particulate matter (e.g., dust) from the surface of a MEMS mirror without external intervention are desired.

SUMMARY

The following presents a simplified summary of one or more implementations to provide a basic understanding of such implementations. This summary is not an extensive overview of all contemplated implementations, and is intended to neither identify key or critical elements of all implementations nor delineate any implementations. Its sole purpose is to present concepts of one or more implementations in a simplified form as a prelude to the more detailed description presented later.

In an implementation, the present disclosure includes an example method of operating a micro electromechanical systems (MEMS) package including selecting one or a plurality of cleaning modes based, at least in part on, one or more of output of a sensor or a maintenance routine. The plurality of cleaning modes include a plurality of different motion modes. Further, the method includes actuating the one of the plurality of cleaning modes across the optical element.

The present disclosure also includes an apparatus having components configured to execute, or means for executing, the above-described methods.

For example, an example device may include a MEMS package having a power source, an actuator, one or more electrical traces, one or more sensors, an optical element, and processing circuitry operatively connected to the power source, the actuator, and the optical element by the electrical traces. The processing circuitry is configured to select one of a plurality of cleaning modes based, at least in part on, one or more of output of a sensor or a maintenance routine, wherein the plurality of cleaning modes include a plurality of different motion modes, and actuate the one of the plurality of cleaning modes across the optical element.

To the accomplishment of the foregoing and related ends, the one or more implementations comprise the features described and particularly pointed out in the claims. This description and the annexed drawings set forth in detail certain illustrative features of the one or more implementations. These features are indicative, however, of but a few ways in which the principles of various implementations may be employed, and this description should include all such implementations and their equivalents.

BRIEF DESCRIPTION OF THE DRAWINGS

The disclosed implementations will be described with the appended drawings, provided to illustrate and not to limit the disclosed implementations, wherein like designations denote like elements, and in which.

DETAILED DESCRIPTION

Figure 1:
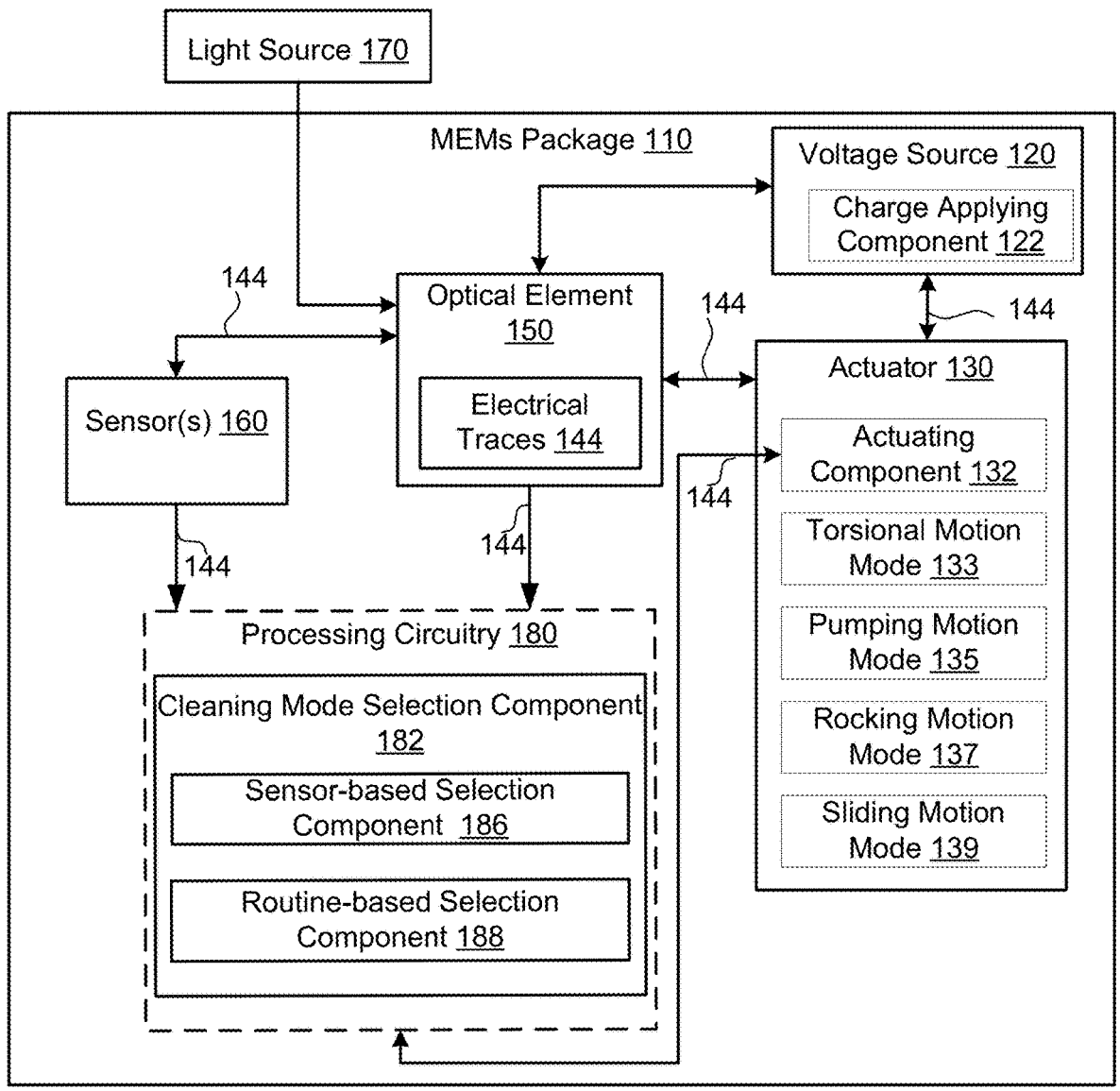
FIG. 1 is a schematic diagram of an example microelectromechanical systems (MEMS) package including an optical element and components for removing particulate accumulation from the optical element, according to this disclosure.

Various implementations are now described referring to the drawings. In this description, for explanation, numerous specific details are in order to provide a thorough understanding of one or more implementations. It may be evident, however, that such implementation(s) may be practiced without these specific details.

The present disclosure generally relates to methods, and apparatus for implementing the methods, for removing particulate accumulation from an optical element, e.g., a mirror or mirror array, of a micro electromechanical systems (MEMS) package. In an implementation, for example, during a particulate matter removal process, the MEMS package may select one or more cleaning modes based on one or more of sensor feedback or according to a maintenance routine. Due to the physical differences between MEMS packages and/or optical elements, determining which cleaning modes are most effective at removing particulate matter during routine maintenance or as a result of specific types of sensor feedback may be accomplished during design and testing of the MEMS package or an external device containing the MEMS package. For instance, a best cleaning mode can be identified by exciting the optical element having accumulated particulate matter separately using each mode and looking at the effect on the resonant frequency. For instance, if the cleaning mode is effective at removing the particular matter, then it would reduce the mass on the optical element, which would increase the resonant frequency. Or, an optical image quality of each cleaning mode can be compared (after being operated to remove particular matter), and one or more best cleaning modes selected based on an improvement in the optical image quality. To implement the cleaning mode, the MEMS package and/or its power source may apply an electrical charge to the optical element to break or disengage an electrical attraction between the optical element and particulate matter accumulated on the optical element surface. For example, the electrical charge may be a repelling charge that opposes an attraction charge built up on the optical element causing the particulate matter to accumulate on the surface of the optical element. In addition to or as an alternative to applying the electrical charge, the MEMS package may further actuate one or a combination of a plurality of motion modes across the optical element, to shake or dislodge the disengaged particulate matter from the surface of the optical element. The methods and apparatus may apply the AC charge simultaneously with, and/or before or after, the actuation of a motion mode. Thus, the combination of a repelling charge and one or more of a plurality of motion modes actuating the optical element may serve to aid in cleaning off particulate matter from the surface of the optical element of the MEMS package.

In some implementations, the one of the cleaning modes may also be selected based on the one or more of the output of the sensor or the maintenance routine. For example, different cleaning modes may be selected based on one or any combination of a change in charge on the surface of the optical element due to electrically attracted particulate matter, determination of a change in the operating frequency of the optical element due to a change in mass of the optical element attributable to particulate matter accumulation on the optical element, a time interval lapse, or any other condition or combination of conditions determined to indicate a time for cleaning of the optical element. For example, a sensor of the MEMS package may detect a position, motion, or frequency of motion of the optical element. The MEMS package may correlate the detected motion to a parameter or value associated with the accumulation of particulate matter on the optical element, then select one of the cleaning modes based on the determined parameter associated with particulate accumulation on the optical element. For example, the determined parameter may be compared to an expected or calibrated value (e.g., an expected mass of the optical element, an expected operating frequency, an expected charge). In some implementations the parameter may be a change in frequency of the optical element, a change in charge across the optical element, a change in mass of the optical element, or other indicator of particulate matter accumulation. As a non-limiting an example, another indication of particulate matter accumulation may include a signal from an external device in operative communication with the MEMS package, indicating that the quality of one or more images produced during normal scanning operations of the MEMS package do not satisfy a quality threshold. One or a combination of applying charge and actuating motion modes may be selected based on determining the charge on the optical element that may be attracting the particulate matter, a change in operating frequency, or a change in mass of the optical element. In one or more of implementations discussed herein, the one or more sensors may be, for example, piezoresistive, piezoelectric, optical, or capacitive sensors, and may be disposed near or adjacent to adjacent to the optical element.

In other implementations, the actuator may actuate one or a combination of "routine" cleaning modes during startup or shutdown of the MEMS package operations, so as to conduct routine cleaning of the optical element. In an additional or alternative implementation, such as where periodic cleaning of the optical element may be desired, the MEMS package may determine whether a threshold interval of time has passed, and actuate one or a combination of routine motion modes in response to determining that the threshold time interval has passed.

In some cases, the disclosed apparatus and methods operate during the cleaning for actuating motion, to propagate waves of a frequency and a type associated with the one or combination of the plurality of the motion modes across the optical element. In other words, each motion mode may be achieved by driving a type of wave at a particular frequency or frequency range. The actuator may inject a wave of the frequency and type associated with a respective motion mode into the optical element to cause a particular type of movement (e.g., a sine wave of 20 KHz for a pumping motion).

In some cases, the power source may be external to the MEMS package. The MEMS package may include electrical contacts or traces that carry voltage across the MEMS package. For instance, the actuator may be electrostatic, electromagnetic, or piezoelectric and the electrical traces may be integrated into the optical element. In some examples, the MEMS package itself may be constructed of a silicon substrate or a combination of materials that include silicon.

Removing particulate matter, e.g., dust and debris, from MEMS packages or any relatively small electrical component is very important for maintaining proper working order of the device. When a MEMS package is exposed to the atmosphere, the elements will pick up particulate matter naturally and due to electrical attraction (e.g., based on operation of the MEMS package). As particulate matter accumulates, the mass of the optical element will increase due to the accumulation, potentially disrupting performance (e.g., a given motion is achieved by a given input signal, and a change in mass affects the resulting motion). In other words, movement of the optical element of the MEMS package is designed based on a specific mass and configuration/structure of the optical element. The small size of such devices means that small amounts of particulate matter accumulation can have substantial effects on overall performance quality of the device.

Removal of the accumulated particulate matter can be difficult, however, because including any additional components may change the size, cost, and/or power resource needs of the MEMS package. These changes may negate the benefits of using small, power efficient packages such as a MEMS package having an optical element for optical applications.

This disclosure provides apparatus and techniques for automatic removal of accumulated particulate matter from an optical element of a MEMS package, thereby enabling the MEMS package to maintain a relatively small size, minimal components, and/or minimal power resource needs without permitting particulate matter accumulation. The techniques include the application of electrical charges or fields to break up existing attraction forces holding particulate matter to the surface of the optical element of the MEMS package, and introducing one or a combination of motions (e.g., vibrating or oscillating motion) to the optical element of the MEMS package to dislodge and/or clean off the particulate matter. The MEMS package may be configured to implement multiple modes of motion and may select one based on several parameters and conditions (e.g., detected charge and/or detected mass) experienced by the optical element of the MEMS package.

This description provides examples, and is not limiting of the scope, applicability, or examples in the claims. Changes may be made in the function and arrangement of elements discussed without departing from the disclosure. Various examples may omit, substitute, or add various procedures or components. For instance, the methods described may be performed in an order different from that described, and various steps may be added, omitted, or combined. Also, features described regarding some examples may be combined in other examples.

Referring to FIG. 1, in accordance with various implementations of the present disclosure, an example MEMS scanning mirror 100 includes a MEMS package 110 having an optical element 150, e.g., a mirror, mirror array, or lens, and one or more optical element surface cleaning components configured to clean off particulate matter from a surface of the optical element 150. During normal operation, e.g., as a scanning mirror, the optical element 150 may be controllably positioned by an actuator 130 to accurately reflect a light source 170 to a desired target location. The light source 170 may include, but is not limited to, a laser beam. The actuator 130 may include, but is not limited to, an electro-magnetic drive, a piezoelectric drive, an electrostatic drive, or thermo-electric drive. MEMS package 110 may utilize the one or more cleaning components to maintain performance of the optical element 150. In one implementation for cleaning the surface of the optical element 150, the MEMS package 110 may include a charge applying component 122 that controls a voltage source 120 for applying an electrical charge, of a fixed or variable charge and magnitude, across the optical element 150 and/or the MEMS package 110 to repel particulate matter, e.g., dust and debris, from the surface of the optical element 150. Additionally, the MEMS package 110 may include an actuating component 132 that controls an actuator 130 for actuating or driving a motion of the optical element 150 of the MEMS package 110. The motion may include modes such as a normal scanning motion mode, e.g., torsional motion mode 133, for normal operation of MEMS package 110, or one or more cleaning motion modes, e.g., motion modes 135, 137, and 139, for dislodging particulate matter from the surface of the optical element 150. In some implementations, the MEMS package 110 may include a cleaning mode selection component 182 including logic for selecting the normal scanning motion mode, e.g. torsional motion mode 133 or one or a combination of a plurality of cleaning motion modes 135, 137, and 139 to be executed by the actuating component 132. For example, the normal scanning motion mode, e.g. torsional motion 133 operates the actuator 130 to provide an input that drives the optical element 150 to perform typical scanning motions for scanning mirror operations. Also, for example, each of the plurality of cleaning motion modes 135, 137, 139, operates the actuator 130 to provide an input that drives the optical element 150 to perform one or more non-scanning motions for cleaning the surface of the optical element 150 of particulate matter. For instance, the plurality of cleaning motion modes 135, 137, 139 may drive the optical element 150 to have motions such as, but not limited to, one or any combination of a torsional motion, a pumping motion, a rocking motion, a sliding motion, or a random combination of these motions. The cleaning mode selection component 182 may include one or more subcomponents that may operate in conjunction with or provide inputs to the logic used by the cleaning mode selection component 182 for making the decision of which motion mode to select. For example, the cleaning mode selection component 182 may include a sensor-based selection component 186 for selecting a cleaning mode, e.g., applying charge and/or actuating a motion mode, based on feedback related to particulate accumulation on a surface of the optical element 150, from one or more sensors 160. The cleaning mode selection component 182 may receive feedback in the form of electrical signals from the sensor(s) 160 or feedback from an external sensor (e.g., feedback from indicating that the quality of an image produced during scanning operations is poor) and may use the sensor feedback to calculate a parameter, e.g., a value, of the amount charge buildup on the surface of optical element 150 or change in optical element 150 mass, and take this parameter into account when making the decision of whether to apply a charge and which charge to apply, e.g., fixed or alternating. Similarly, the determined parameter may be taken into account when determining whether to actuate a motion mode, and which motion mode 133-139 or which combination of motion modes to select (e.g., a relatively higher mass or significant change in magnitude of charge may dictate one type of motion, while a relatively lower mass may dictate another type of motion). The cleaning mode selection component 182 may further include a routine-based selection component 188 for initiating one or more cleaning modes according to a routine, such as one or more identified events (e.g., turning the device on and/or off), a schedule (e.g., a time-based parameter), or any other type of routine condition.

In various implementations, the cleaning mode selection component 182 may select one or more cleaning modes from a plurality of pre-determined configurations based on the sensor feedback or a maintenance routine. For example, the cleaning mode selection component 182 may receive a particular type of sensor feedback and may selection one or more cleaning modes associated with the received type of sensor feedback. In another example, the cleaning mode selection component 182 may determine that particulate removal maintenance is scheduled to occur and may select one or more cleaning modes associated with the performance of maintenance.

Determining which cleaning modes are best suited for routine-based particulate removal and sensor-based particulate removal may be performed during design, testing, and/or construction of the MEMS package 110 and the results stored for use by the cleaning mode selection component 182. For example, during testing, particulate matter may be permitted to accumulate on the optical element 150 of the MEMS package 110. The accumulation of particulate matter may produce varied forms of sensor feedback. In response to this feedback, charge may be applied to the optical element 150, alone or in combination with each of motion mode 133-139, which may also be applied individually. Thus, for each form of sensor feedback indicating particulate accumulation on the optical element 150, the optical element may be subjected to each cleaning mode, charge application or motion actuation. Multiple trials may be performed for each form of sensor feedback to determine which combination of charge application and motion actuation (e.g., which motion modes) is most effective in removing particulate matter from the surface of the optical element 150. Different forms of sensor feedback such as mass changes, charge changes, frequency changes, or optical quality changes may be best addressed by different combinations of one or more cleaning modes. Routine-based cleaning may be similarly determined, by performing each cleaning mode alone and in combination, during startup/shutdown of the MEMS package 110 and at varying intervals.

Because the size of a MEMS package 110, as well as the number and size of its subcomponents may vary, the natural operating frequency of the motion modes 133-139 may vary. During the routine-based and sensor-based cleaning mode testing of the MEMS package 110, the natural operating frequency for each motion mod 133-139 may be determined. For example, the optical element 150 may be excited by actuating element 132 across a range of frequencies, e.g., 10 Hz to 200 kHz to determine which frequency or subset of the frequency range produced the desired motion mode at its natural frequency. This natural frequency or frequency range may be stored in association with the motion mode to enable the actuating component 132 to drive the associated motion mode.

Accordingly, in various implementations, the cleaning mode selection component 182 using either the sensor-based selection component 186 or the routine-based selection component 188 may select a one or more cleaning modes either at random or based on pre-determined configurations determined as discussed above. For example, routine-based selection component 188 may, at startup of the MEMS package 110, identify that a sliding motion mode 139 is associated with MEMS package 110 startup and may instruct the actuating component 132 to drive the sliding motion mode 139 at an operating frequency stored in association therewith. In another example, in response to receiving feedback from sensor(s) 160 that the mass of the optical element 150 has changed due to particulate accumulation, the sensor-based selection component 188 may select cleaning modes for applying charge and actuating a motion mode (e.g., motion modes 135, 137, and 139) that are associated with the specific type of sensor feedback received. The cleaning mode selection component 182 and/or sensor-based selection component 186 may signal charge applying component 122 and actuating component 132 to implement the type of charge and the motion mode of a type and frequency as determined by the techniques discussed above.

Sensor-based selection component 186 may enable the MEMS package to determine when and how to implement a particulate matter removal technique based on current operating conditions. These techniques may enable spontaneous removal of particulate accumulation from the optical element 150 if scheduled maintenance is insufficient or if the MEMS package 110 encounters an environment with a high particulate concentration.

Conversely, routine-based selection component 188 may enable MEMS package 110 to perform regular maintenance to remove particulate matter (e.g., dust) before significant accumulation can occur. Such maintenance may be performed with or as an alternative to the sensor-based techniques described above. The routine-based selection component 188 is operable to select a motion mode for removal of particulate matter according to a predetermined routine, such as during start up or shutdown of the MEMS package 110. Further, the routine-based selection component 188 may select a motion mode to remove particulate matter from the optical element 150 according to predetermined time intervals.

The one or more sensors 160 may include, but are not limited to, piezoresistive, piezoelectric, optical, or capacitive sensors or strain gauges.

During regular scanning operation of the MEMS package 110, voltage source 120 may apply electrical current, e.g., using electrical traces 144, to actuator 130 to initiate scanning. The voltage source 120 may be a power source integrated into the MEMS package 110 or conductive terminals/contacts electrically connected to an external power source. Applying charge and exposure of the MEMS package 110 components to the atmosphere may cause the buildup of particulate matter, e.g., dust, on the surface of the optical element 150. Electrical traces 144 positioned around, or embedded in or integrated into, the optical element 150 may carry an electrical current input by the actuator 130 to cause a force (e.g., a Lorenz force) to drive (e.g., move or position or cause resonance of) the optical element 150 may also generate an electrostatic field during MEMS package 110 operation. This electrostatic field may attract particulate matter having an electrical charge having a polarity opposite of a polarity of an electrical charge carried by the optical element 150.

To dislodge particulate matter that is electrically attractive to the surface of the optical element 150, the voltage source 120 may use charge applying component 122 to apply a fixed current, an alternating current (AC), or a combination of both, across the optical element 150 and/or the MEMS package 110 via the electrical traces 144. The fixed charge may have an opposite polarization of the attracting charge holding the particulate matter to the surface of the optical element 150. Further, charge applying component 122 may provide an alternating charge or current (AC), where the shift in polarization of electrical charge across the optical element 150 resulting from introducing AC may cause previously attractive particles to disengage or repel from the surface of the optical element 150.

Combined with, or as an alternative to, introducing a fixed charge, an AC, or both, by the voltage source 120, actuator 130 may be signaled to initiate a motion mode, e.g., motion modes 135, 137, and 139. For example, processing circuitry 180 included in or external but connected to the MEMS package 110 may execute cleaning mode selection component 182 to select one or more of the plurality of motion modes 135, 137, and 139 to aid in removal of particulate matter from the surface of the optical element 150. The processing circuitry 180 may use cleaning mode selection component 182 and/or sensor-based selection component 186 and routine-based selection component 188 to select a motion mode via one of several techniques.

In an implementation, cleaning mode selection component 182 may select a motion mode based on a charge built up across the optical element 150 using sensor-based selection component 186. Changes in the magnitude of charge on the surface of the optical element 150 associated with particulate matter accumulation may be determined by converting the output of the one or more sensors 160 into a parameter, e.g., a value indicating current magnitude of a charge on the surface of the optical element 150, and comparing this parameter to an expected magnitude of charge on the surface of the optical element 150. In some implementations, one or more of the sensors 160 may be piezoelectric elements (e.g., crystals, ceramics, etc.), which may convert motion of the optical element 150 during normal scanning operations, e.g., torsional mode 133, into electric current on the optical element. The magnitude of this applied charge may be expected or known. If processing circuitry 180 determines that the actual charge across the optical element 150 differs from the expected charge, then it may determine that particulate has accumulated on the optical element 150.

In additional implementations, the one or more sensors 160 may include one or more piezoresistive elements for converting mechanical energy into a change in resistance, which may be conveyed by electrical signals. The one or more sensors 160 may detect motion of the MEMS package 110 and communicate the motion to the sensor-based selection component 186 using electrical traces 144. The sensor-based selection component 186 may use the information received from the one or more sensors 160 to calculate or otherwise determine a change in the magnitude of charge on the surface of the optical element 150 and corresponding to the detected level of motion (e.g., mechanical energy). The cleaning mode selection component 182 may then select to apply charge or actuate a motion mode, e.g. motion modes 135, 137, and 139, based, at least in part, on the determined charge build up.

In another implementation, cleaning mode section component 182 may select a motion mode based on a frequency at which the MEMS package 110 is moving, vibrating, undulating, etc. Because normal operation of the MEMS package 110 for scanning functions may produce a normal operating frequency, e.g., 20 KHz, variation in the frequency may indicate added mass attributable to an accumulation of particulate matter on the surface of the optical element 150.

As discussed above, the motion of optical element 150 110 may be detected or identified by the one or more sensors 160 and the associated mechanical energy converted into an electrical signal sent to the processing circuitry 180. The received information may be used by cleaning mode selection component 182 and/or sensor-based selection component 186 to calculate or otherwise determine a parameter, such as a value indicating the current operating frequency of the optical element 150. The sensor-based selection component 186 may compare the parameter to an expected operating frequency. The detected frequency may be communicated to the accumulation determining to determine a change in operating frequency. In some implementations, the change in operating frequency may be used to calculate or otherwise determine a change in the mass of the optical element 150 attributable to accumulation of particulate matter.

In another implementation, the cleaning mode selection component 182 may receive an indication that one or more images scanned during normal scanning operations, e.g., torsional mode 133, do not meet a quality threshold. For example an external device operatively communicating with the MEMS package 110 (e.g., a camera, head-mounted display, or the like) may analyze images scanned by MEMS package 110 and may determine that the image quality is poor due to optical element occlusion. The external device may signal to processing circuitry 180 and cleaning mode selection component 182 that the optical element should be cleaned to remove particulate matter. The indication from the external device may be treated by sensor-based selection component 186 in the same manner as sensor feedback from sensor(s) 160.

Therefore, the sensor-base selection component 186 may use the feedback of the one or more sensors 160 to calculate a parameter indicating either a current magnitude of charge on the optical element 150, a current operating frequency of the optical element 150, or a scanned image quality that does not meet a quality threshold. In both implementations, the calculated parameter may be compared against an expected value to determine a change in operating conditions that resulting from the accumulation of particulate matter on the surface of the optical element 150. Cleaning mode selection component 182 and/or sensor-based selection component 196 may use this estimate of strain to determine whether to apply a charge, and what charge should be applied; and whether to actuate one of the motion modes and which motion mode should be selected.

Further implementations may include selecting, by the cleaning mode selection component 182, and application of electrical charge and/or actuation of one or more of the plurality of motion modes 135, 1137, and 139 during startup or shutdown procedures of the MEMS package 110. For example, the routine-based selection component 188 may detect that the MEMS package 110 is shutting off and may signal to the charge applying component 122 and/or actuating component 132 of the actuator 130 to initiate a motion mode from the plurality of motion modes 135, 137, and 139. In another example, the routine-based selection component 192 may signal a default motion mode via the actuating component 132 of the actuator 130 to initiate the motion mode during startup of the MEMS package 110. In some implementations, the selected cleaning mode may be predetermined such that the same combination of cleaning modes is used for each startup or shutdown maintenance cleaning. In some implementations, the selection of a cleaning mode as part of a routine maintenance schedule may be made at random.

Similarly, the cleaning mode selection component 182 may use routine-based selection component 188 to select a cleaning mode and/or motion mode based on an elapsed duration of time. At periodic intervals, the routine-based selection component 188 may determine that a threshold amount of time (e.g., an interval) has passed. The cleaning mode selection component 182 may determine whether to apply charge and/or actuate a motion mode, e.g., motion modes 135, 137, and 139. For example, the routine-based selection component 188 may select one of the plurality of motion modes 135, 137, and 139. In some implementations, the motion mode may be selected at random, by a predetermined rule or setting, or according to the time that has lapsed.

As mentioned above, the actuator 130 may drive various forms of motion of the optical element 150 according to the normal scanning motion mode, e.g., torsional motion mode 133 or one or a combination of a plurality of motion modes 135-139 for cleaning the optical element 150. The actuating component 132 may initiate scanning, oscillation, vibration, or other forms of motion in the optical element 150, as described with greater detail referring to FIGS. 8A-8D. The actuator 130, using actuating component 132, may introduce waves of varying frequency into the MEMS package 110 or optical element 150. The actuator 130, by way of actuating component 132, may implement the motion modes selected by motion mode component 182 according to the techniques described.

Figure 2:
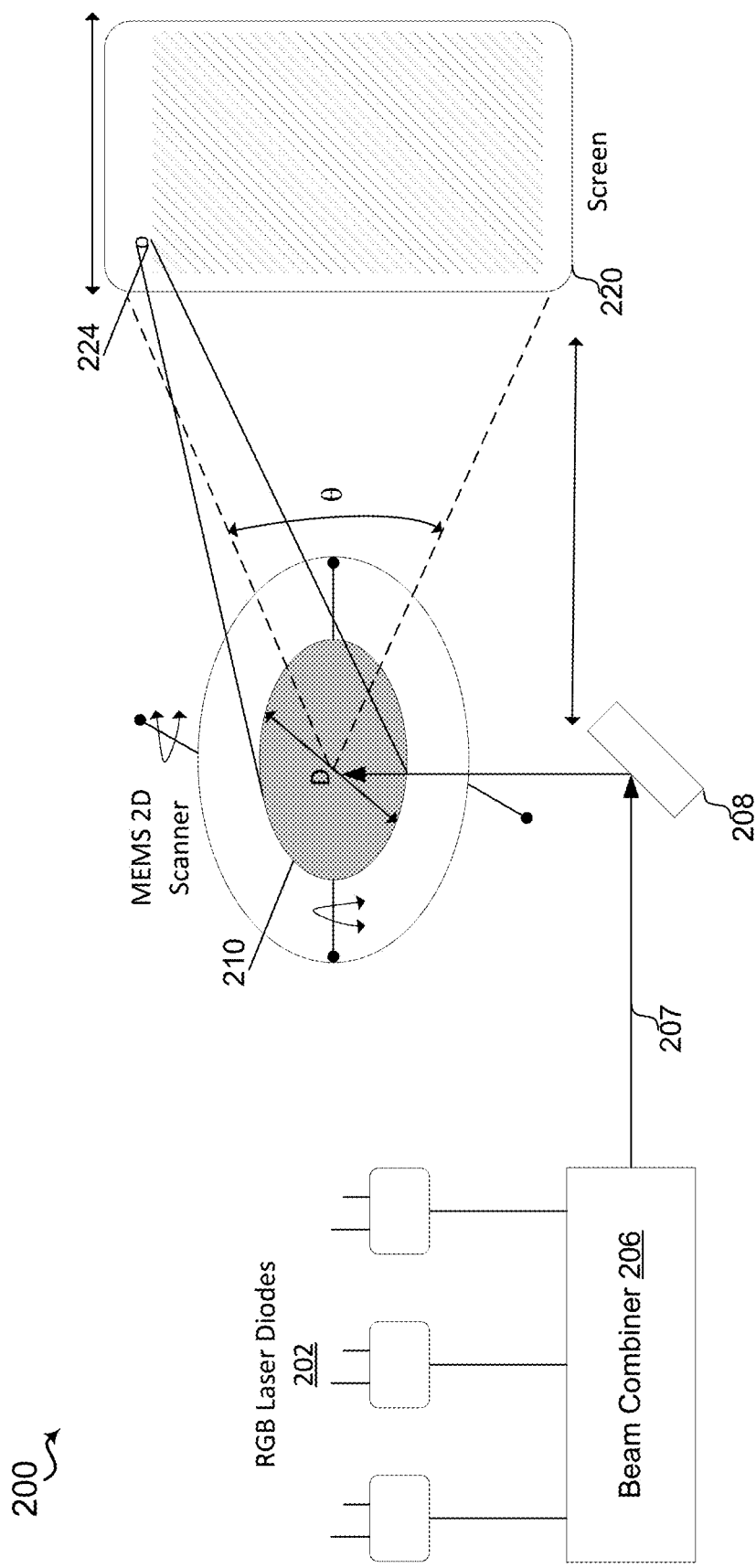
FIG. 2 is a schematic diagram of an example use of the MEMS package of FIG. 1 in a computing device display.

Referring to FIG. 2, an example use of a MEMS package, such as in the form of a MEMS 2D scanner 200, may be in a computing device display, includes one or more RGB laser diodes 202 combined with a beam combiner 206 that may generate and transmit a light beam 207 to a first deflector 208, such as a mirror. The first deflector 208 may deflect the light beam 207 to MEMS two-dimensional scanning mirror 210, e.g., an optical element surrounded by an electrical coil. MEMS 2D scanning mirror 210 may rotate in two dimensions to reflect the light beam 207 at one of a plurality of angles, Θ, onto any point 224 across a length and width of a screen 220 to output a display.

Figure 3:
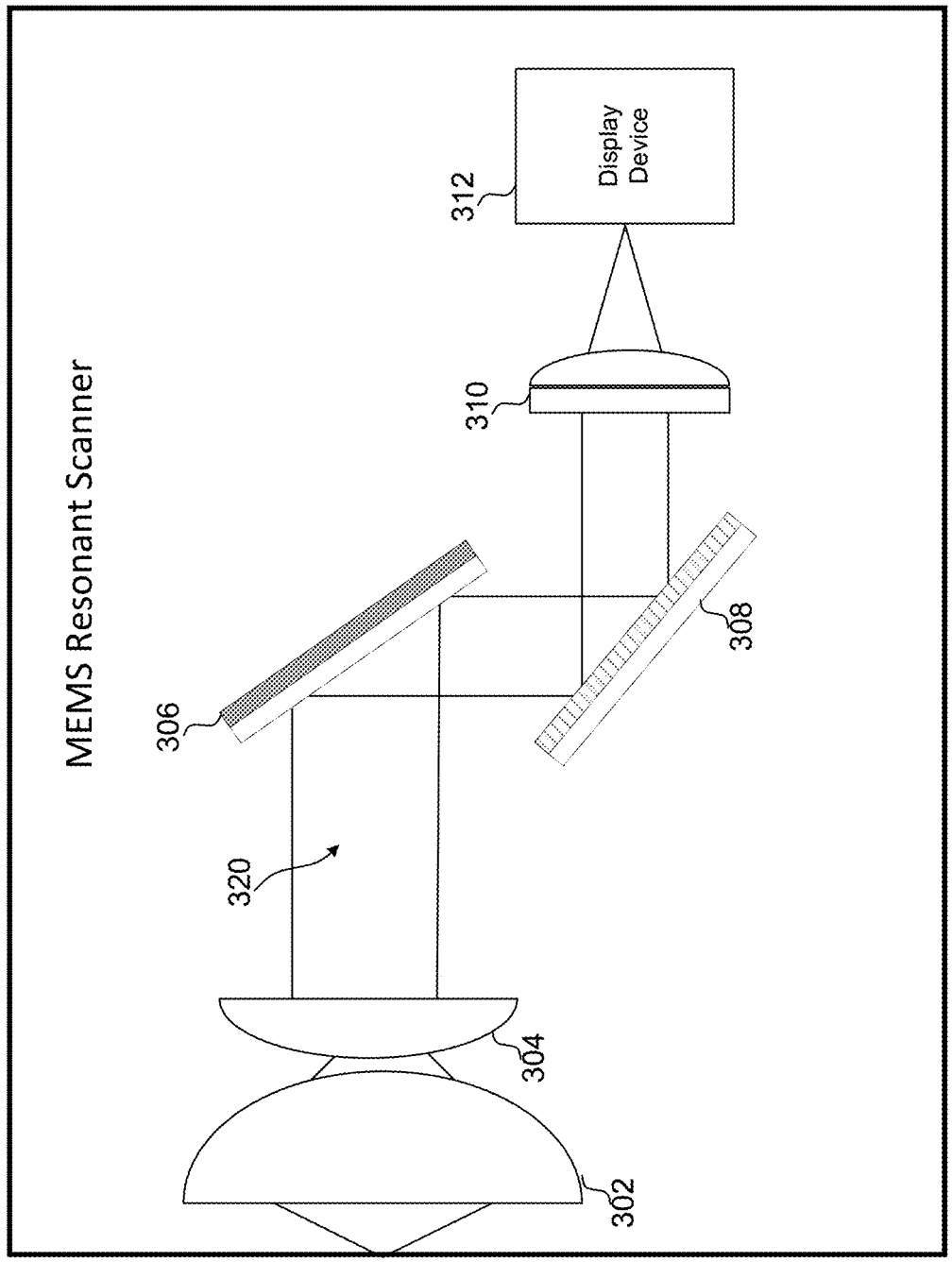
FIG. 3 is a schematic diagram of an example use of the MEMS package of FIG. 1 in an imaging system.

Referring to FIG. 3, an example use of a MEMS package in imaging, such as in a MEMS resonant scanner 330, includes two lenses 302 and 304 that may be used at an input pupil to direct light 320 toward a reflector 306 such as a mirror. Light 320 reflected from the mirror 306 may be reflected onto a MEMS package 308. The light 320 reflected from the MEMS package 308 may be reflected to an output pupil including one or more further optical elements, such as a waveplate and concave lens combination 310. The output pupil may direct the light to a display of a display device 312 for viewing by a user.

Figure 4:
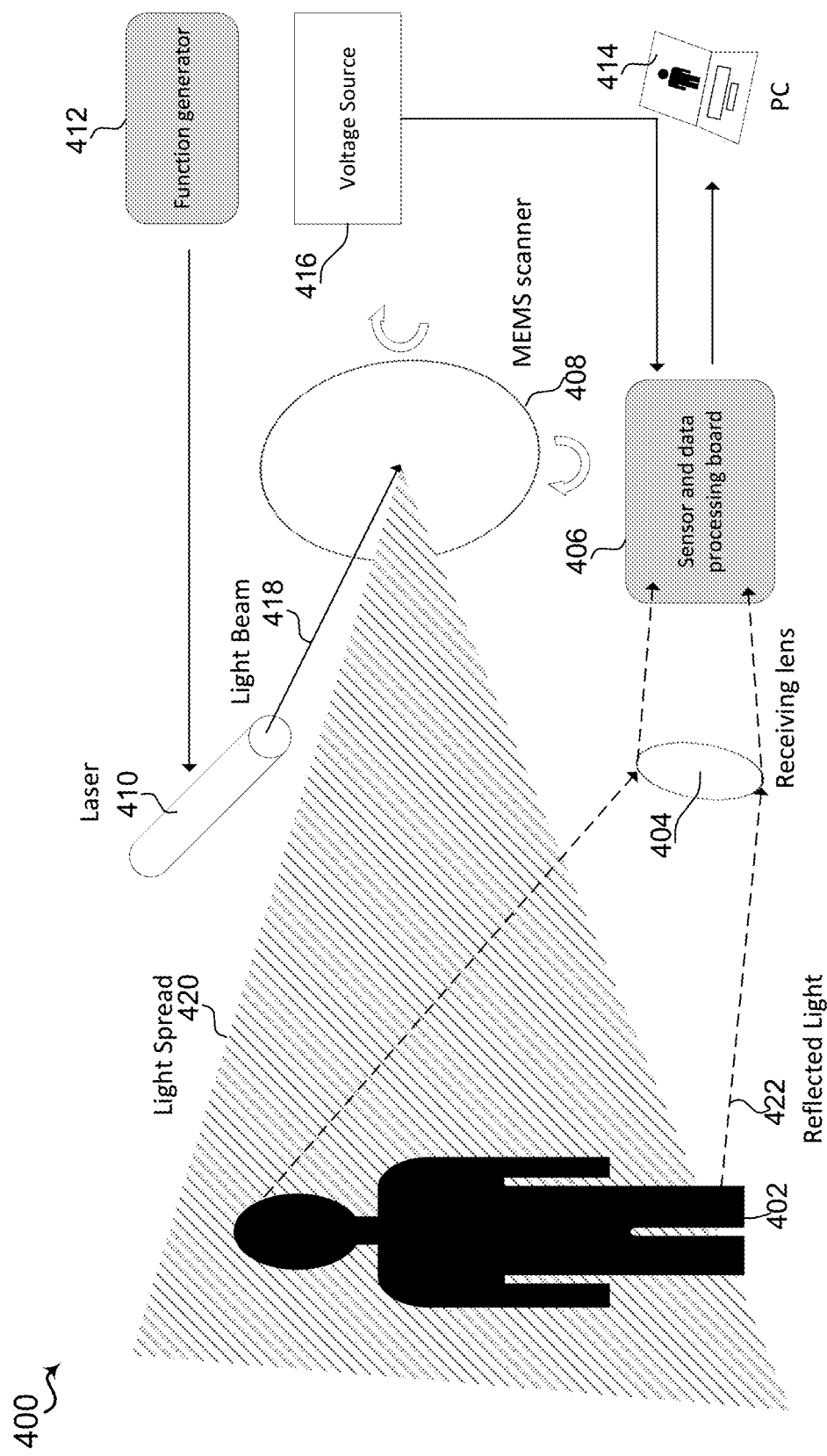
FIG. 4 is a schematic diagram of an example use of the MEMS package of FIG. 1 in a light detection and ranging (LIDAR) system.

Referring to FIG. 4, an example use of a MEMS package in light detection and ranging (LIDAR) system 400 includes a function generator 412 internal or external to the MEMS package 408. The function generator 412 may instruct a laser beam generator 410 to direct a light beam 418 toward the MEMS package scanner 408. The MEMS package scanner 408 may rotate in one or more directions, deflecting the light beam 418 into a cone-shaped spread of light 420. If the light spread 420 falls on an object 402, the light 422 will be partially absorbed by the object 402. Any light 422 deflected by the object 402 may be received by a receiving lens 404. The light 422 may be accepted by a sensor and data processing board 406 of a light collecting device and sent to a computing device 414 powered by a voltage source 416. The computing device 414 may determine a distance of the object 402 from the MEMS package scanner 408 based on the received light 422.

Figure 5:
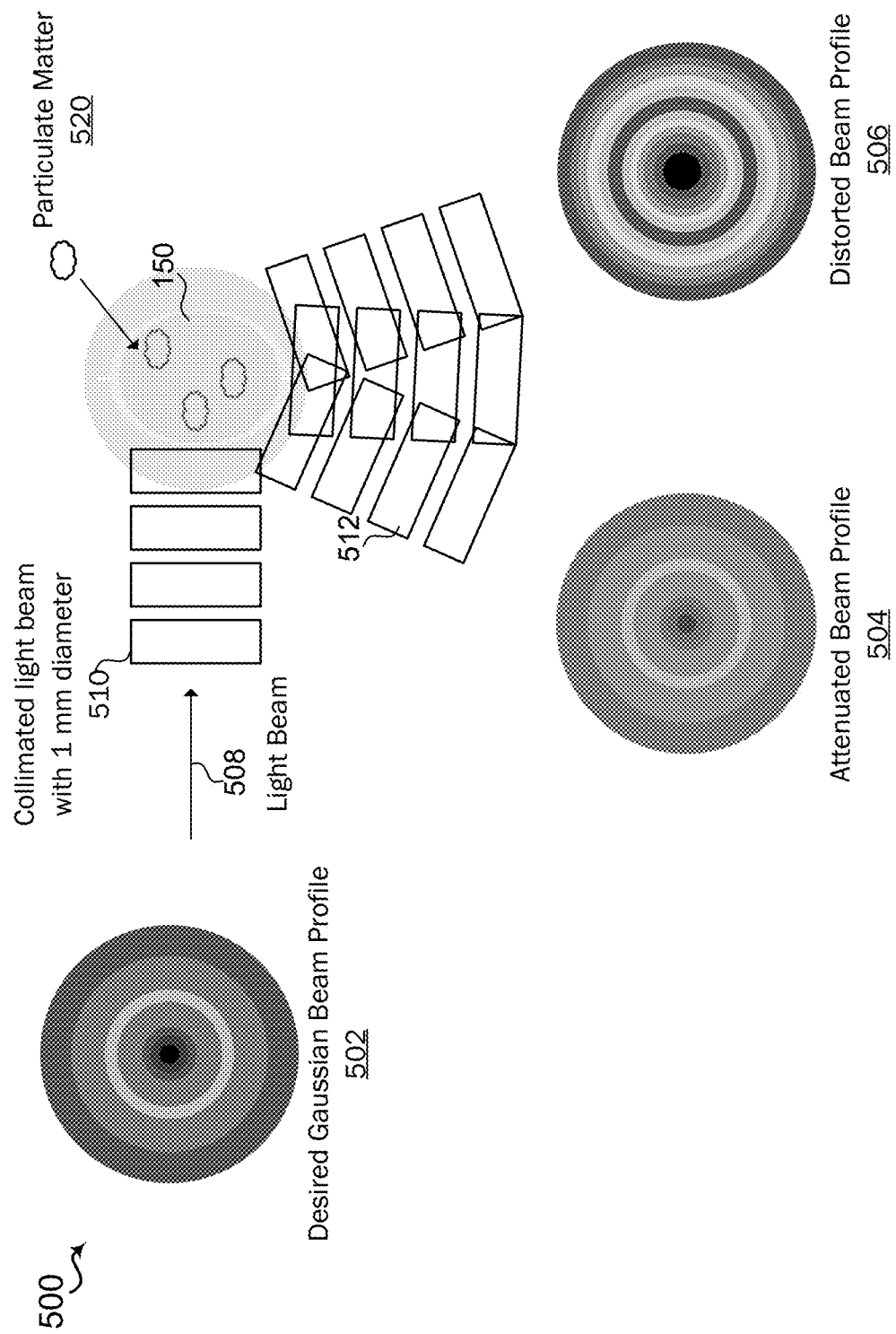
FIG. 5 is a schematic diagram of light attenuation and distortion resulting from particulate accumulation on an optical element of the MEMS package of FIG. 1.

Referring to FIG. 5, an example portion of an optical system 500 exhibits light distortion due to the accumulation of particulate matter on the optical element 150 that may be part of MEMS package 110. Light 508 that is incident upon the optical element 150 may have a normal or desired Gaussian beam profile 502. For example, light beams emitted by an external light source toward the optical element 150 may be a beam of monochromatic electromagnetic radiation having transverse magnetic and electric field amplitude profiles given by the Gaussian function; this also implies a Gaussian intensity (irradiance) profile. In one example, which should not be construed as limiting, the desired Gaussian beam profile 502 may be a collimated light beam with a 1 mm diameter 510.

When the MEMS package 110 is exposed to the atmosphere, its surfaces may accumulate particulate matter. Accumulation of particulate matter on the surface of the optical element 150 may be accelerated during operation of MEMS package 110 because the electrical traces (e.g., electrical traces 144) integrated into the optical element 150 may generate an electrostatic field near the surface of the optical element 150, where the electrostatic field is attractive to particulate matter 520.

As particulate matter 520 accumulates on the surface of the optical element 150, the added mass of the particulate matter 520 may affect the function of the MEMS package 110. The MEMS package 110, particularly the voltage source (e.g., voltage source 120) and the actuator (e.g., actuator 130) may actuate or drive scanning motion of the optical element 150 at a certain predetermined mass. Adding mass to the optical element 150 may render any input applied by the actuator (e.g., actuator 130) insufficient to drive the optical element 150 at a frequency required for normal scanning operation, or may distort or change the frequency of operation. The relatively small size of the MEMS package 110 means that relatively small additions of mass to the optical element 150 may disrupt the MEMS package 110 performance.

Further, the accumulation of particulate matter 520 over time may cause occlusion of the surface of the optical element 150 and/or the scattering of light incident on the optical element 150. For example, portions of the desired Gaussian beam 502 incident on particulate matter 520 rather than the surface of the optical element 150 may be deflected or absorbed, leading to the distortion or attenuation of the reflected light beam 512. In some cases, the accumulation of particulate matter 520 may cause a detectable change in the charge built up on the optical element 150 during operations.

Changes in the mass or the amount of unblocked surface area of the optical element 150 may cause the reflected light beam 512 to have an attenuated beam profile 504 in which the light is lost, or to have a distorted beam profile 506, in which light is deflected improperly. Various implementations of the present disclosure may reduce the accumulation of particulate matter 520 on the optical element 150 of the MEMS package 110 by performing one or more of: applying a charge across the MEMS package 110 and/or optical component 150 to disrupt electrical attraction between the particulate matter 520 and the optical element 150; and/or actuating a vibrational or oscillating motion of the optical element 150 to dislodge particulate matter 520.

FIGS. 6, 7, and 8A-8D include example operations of a MEMS package (e.g., MEMS package 110). For the purposes of providing a clear example implementation, the MEMS package 110 is shown having an optical element 150 physically and operatively connected to two opposing end portions by torsion bars. This structure is provided for exemplary purposes and is not intended to limit the implementation of the disclosed techniques to single structure or configuration. MEMS package 110 may include other structures for supporting the optical element 150 and/or actuating the motions described herein.

Figure 6:
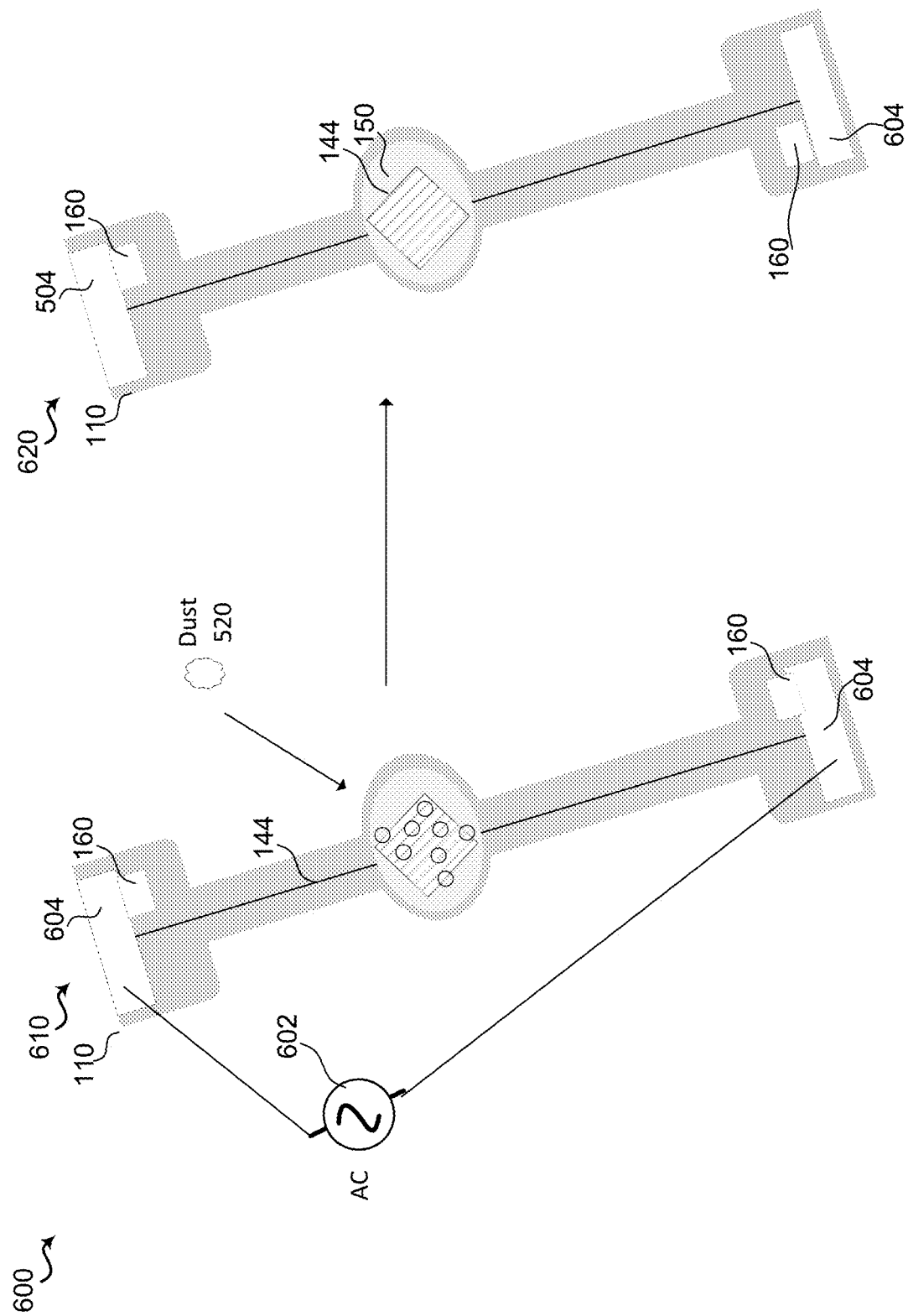
FIG. 6 is a schematic diagram of an example implementation of the MEMS package of FIG. 1 before and after execution of particulate removal techniques according to the present disclosure.

Referring to FIG. 6, an example of a partial MEMS package 600 (e.g., a portion of MEMS package 110) has a first state 610 before execution of particulate matter removal techniques described herein, and a second state 620 after execution of the particulate matter removal techniques described herein. The MEMS package 110 may have electrical contacts 604 disposed at opposing ends of the MEMS package 110. These electrical contacts 604 may be electrically connected to the optical element 150 and an integrated actuator (e.g., actuator 130, not shown) by electrical traces 144. The electrical traces 144 may be an electrically conductive material that can carry an electrical current, which may cause the optical element to hold an electrostatic charge attractive to particulate matter 520.

One or more types of sensors 160 may be disposed near or adjacent to the torsion bars supporting the optical element 150. These sensors 160 may be piezoresistive, optical, or capacitive elements that measure strain on the optical element 150 and/or efficiency of the scanning motion. For example, a piezoresistive element may convert mechanical motion of the optical element 150 during scanning operation into an electrical signal. This electrical signal may be used to calculate a parameter or value indicating the operating frequency of the optical element 150. For example, a stress dependent voltage drop $V_r$ may be linear and may be represented by a function:

$$V_r = R_0 I [1 + \pi_L \sigma_{xx} + \pi_T (\sigma_{yy} + \sigma_{zz})]$$

where $R_0$ denotes stress-free resistance; I denotes an applied current, $\pi_T$ and $\pi_L$ denote transverse and longitudinal piezoresistive coefficients respectively, and $\sigma_{ij}$ denotes three tensile stress components. In such examples, the value of the piezoresistive coefficients may vary widely based on the position and orientation of the sensors (e.g., sensors 16). This function may vary according to the type of sensors implemented in the MEMS package 110.

The operating frequency may be compared against a predetermined "normal" or calibrated operating frequency or a range of acceptable operating frequencies, for a given driving input of the actuator 130, to determine whether the added mass of the particulate matter 520 is causing the operational frequency to fall outside of acceptable ranges or fall below a threshold. In another example, the electrical signal from the one or more sensors 160 may be used to determine a parameter or value indicating the magnitude of a charge on the optical element surface due to accumulation of particulate matter 520. The sensors 160 in such implementations may be piezoelectric sensors or piezoresistive sensors, or any other type of sensor capable of detecting a change in mass or a change in electrical charge on the optical element 150. In some implementations, the sensors 160 may be two sensors of the same type, each sensor disposed on opposing sides of the optical element 150. In some implementations, multiple sensors of different types may be disposed on one or more sides of the optical element 150.

In various implementations, a "torsional" motion mode 133 may be implemented during scanning operations. As particulate matter 520 accumulates on the surface of the optical element 150 and impedes efficiency of torsional movement and reduces image quality, however, the MEMS package 110 may select a cleaning mode such as the application of charge and or the actuation of motion. The MEMS package may apply the selected charge and/or actuate one or more of the plurality of cleaning motion modes 135, 137, and 139 to dislodge accumulated particulate matter 520. The actuator 130, operating according to the plurality of cleaning motion modes 135, 137, and 139, may drive waves of different frequencies to generate different motions of the optical element 150. When combined with applying a repelling charge 602 by the voltage source 120, the surface of the optical element 150 may be cleared of particulate matter 520, thereby requiring no additional components or intervention to ensure reduced particulate or particulate-free operation.

In some implementations, particulate matter removal may be initiated by a user, such as upon noticing a degradation in image quality, automatically as part of the default or interval-based maintenance routine of the MEMS package 110, or upon detection of excessive accumulation of particulate matter 520 by the one or more sensors 160.

Figure 7:
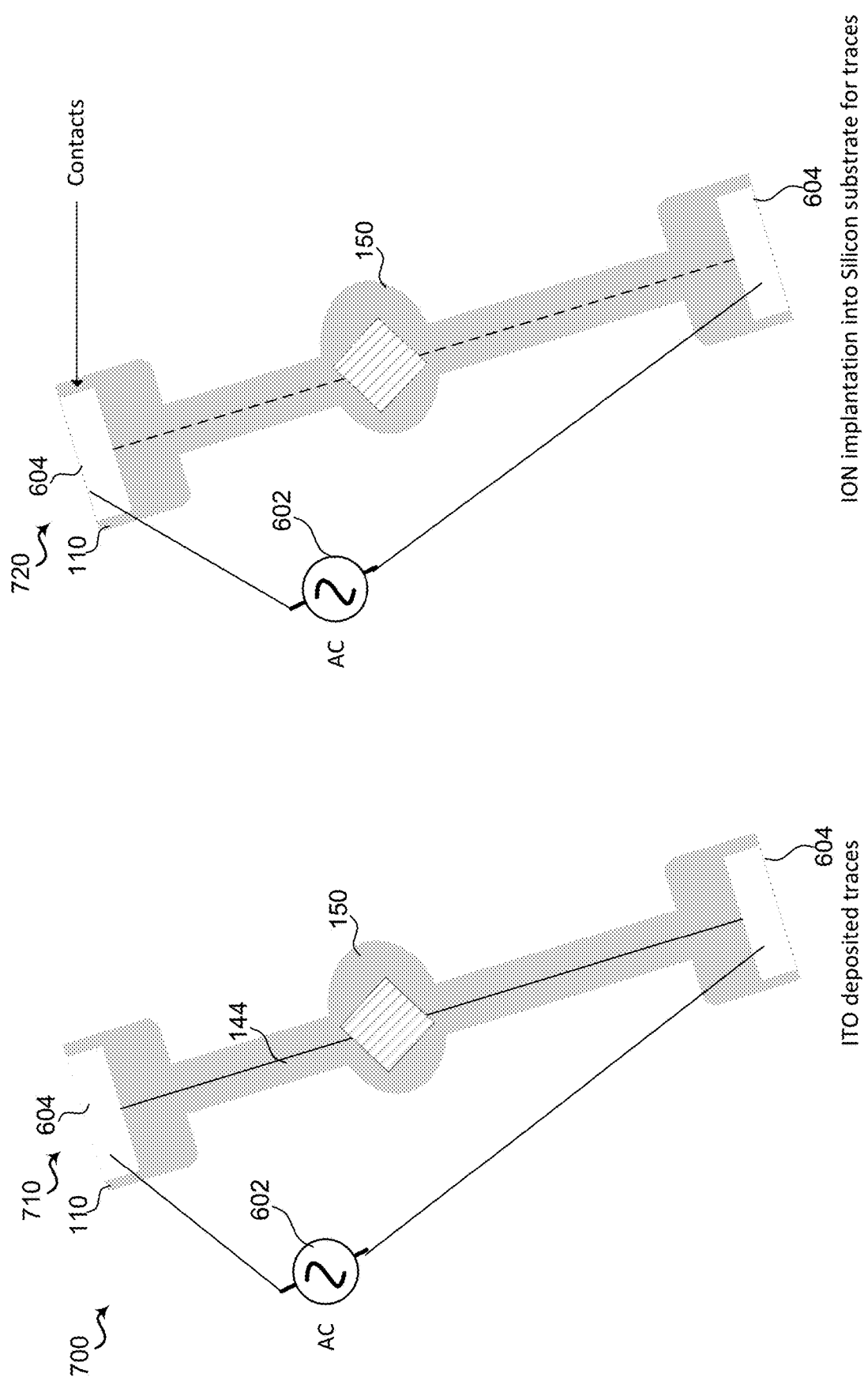
FIG. 7 is a schematic diagram of applying current through the MEMS package of FIG. 6, according to the present disclosure.

Referring to FIG. 7, an example of a partial MEMS package 700 (e.g., a portion of MEMS package 110) has a first configuration 710 having a layer of electrical traces 144 and a second configuration 720 including embedded electrical traces 144. As illustrated in FIG. 7, the MEMS package 110 may have electrical contacts 604 disposed at opposing ends of the MEMS package. These electrical contacts 604 may be electrically connected to the optical element 150 and an integrated actuator (e.g., actuator 130, not shown) by electrical traces 144. The electrical traces 144 may be an electrically conductive material that can carry an electrical current.

In some implementations, the MEMS package, and more particularly the optical element 150, may be constructed from a silicon substrate or a combination of materials including silicon. Electrical traces 144 may be embedded into or integrally formed with the optical element 150. It is desirous that the electrical traces remain below the surface of the optical element to avoid distortion of reflected light beams. The embedded traces 144 may have any configuration or structure contained within the perimeters of the optical element 150 and in some configurations are configured to enable distribution of charge evenly across the optical element 150.

In some examples, the electrical traces 144 may be composed of an indium tin oxide (ITO) layer. In other examples, the electrical traces 144 may be integrated into the silicon substrate by an ion implantation technique.

Referring to FIGS. 8A-8D, example motion modes 800, 825, 850, and 875 of a MEMS package (e.g., MEMS package 110) may be actuated in addition to or as an alternative to applying a repelling charge across the optical element 150. Motion modes may be driven by actuator 130, which may be piezoelectric, electrostatic, electromagnetic or any other actuator capable of driving waves of different frequencies into the optical element 150.

Figure 8:
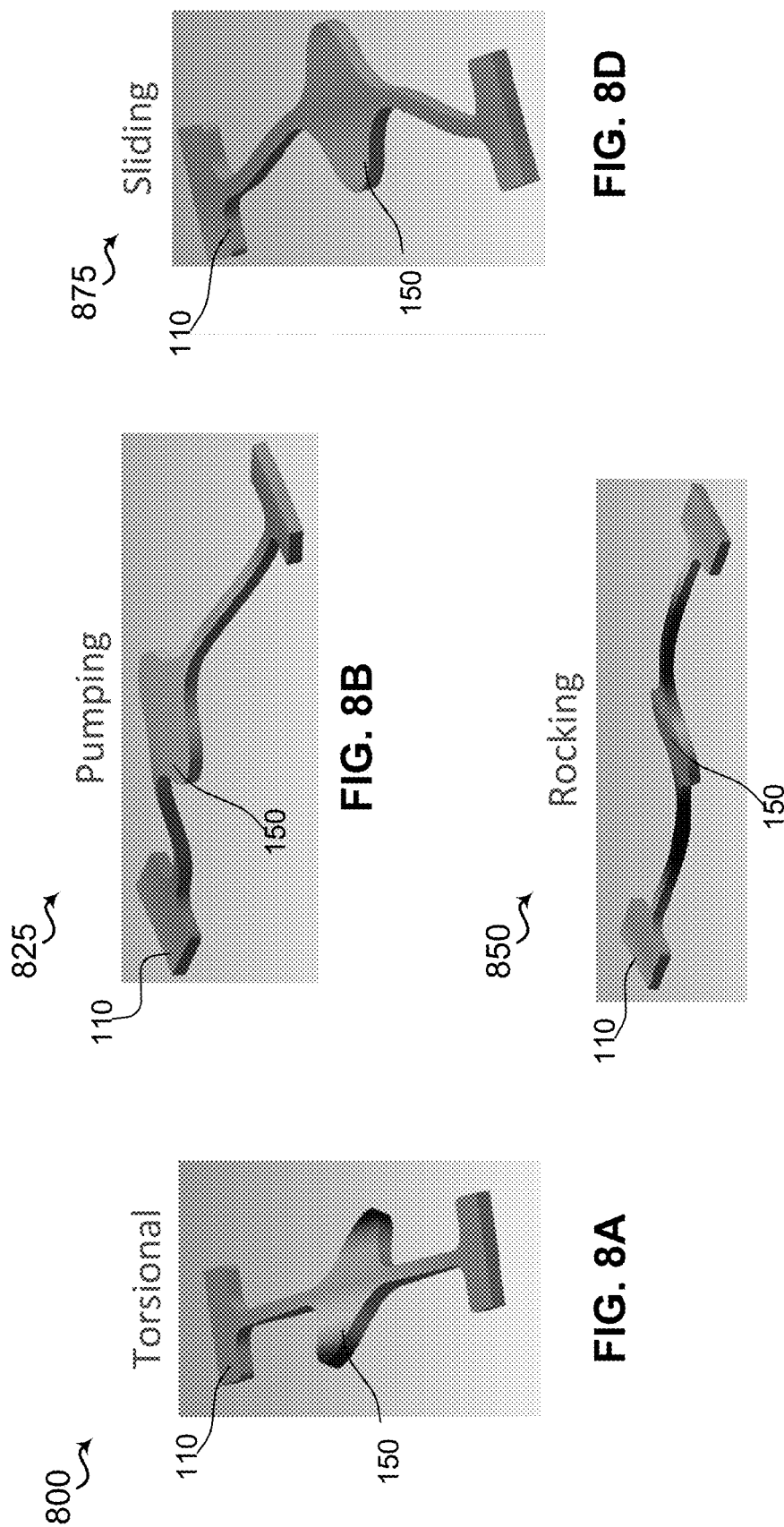
FIG. 8A is a schematic diagram of the MEMS package of FIG. 6 undergoing a torsional motion mode according to the present disclosure.
FIG. 8B is a schematic diagram of the MEMS package of FIG. 6 undergoing a pumping motion mode according to the present disclosure.
FIG. 8C is a schematic diagram of the MEMS package of FIG. 6 undergoing a rocking motion mode according to the present disclosure.
FIG. 8D is a schematic diagram of the MEMS package of FIG. 6 undergoing a sliding motion mode according to the present disclosure.

Referring to FIG. 8A, the optical element 150 of the MEMS package 110 may experience or undergo a motion mode 800, e.g., torsional motion mode 133, during scanning operations, e.g., normal scanning motion mode. Torsional motion mode 133 may be achieved by actuating, such as by actuating component 132 of actuator 130, a sinusoidal or ramp type frequency wave into the optical element 150. During torsional motion mode 800, the optical element 150 may rotate about a center line running the length of the MEMS package 110. In some implementations, this motion may be random or periodic.

Referring to FIG. 8B, the MEMS package 110 may experience or undergo motion mode 825, e.g., pumping motion mode 8135, e.g., one of the plurality of cleaning mode motions, during particulate matter removal operations. Pumping motion mode 135 may be achieved by actuating, such as by actuating component 132 of actuator 130, a sine wave (e.g., a sine wave of 1 Hz to 200 kHz, such as 20 kHz) into the optical element 150. During pumping motion mode 825, the optical element 150 may remain generally flat but may rise and fall relative to the ends of the MEMS package as the torsion bars of the MEMS package 110 rise and fall.

Referring to FIG. 8C, the MEMS package 110 may experience or undergo a motion mode 850, e.g., rocking motion mode 137, during particulate matter removal operations. Rocking motion mode 137 may be achieved by actuating, such as by actuating component 132 of actuator 130, a wave of a frequency that may vary according to the design of the MEMS package (e.g., 10 kHz) into the optical element 150. During rocking motion mode 850, the optical element 150 may rotate about an axis perpendicular to, but in a same plane as the torsion bars (prior to being driven), creating a propagating wave motion.

Referring to FIG. 8D, the MEMS package 110 may experience or undergo a motion mode 875, e.g., sliding motion mode 139, during particulate matter removal operations. Sliding motion mode 139 may be achieved by actuating, such as by actuating component 132 of actuator 130, a wave of a frequency that may vary according to the design of the MEMS package (e.g., 10 kHz) into the optical element 150. During sliding motion mode 875, the optical element 150 may remain generally flat but may translate in a plane essentially parallel to the plane of electrical contacts 604, e.g., from side-to-side to the left and right of the torsion bars.

Figure 9:
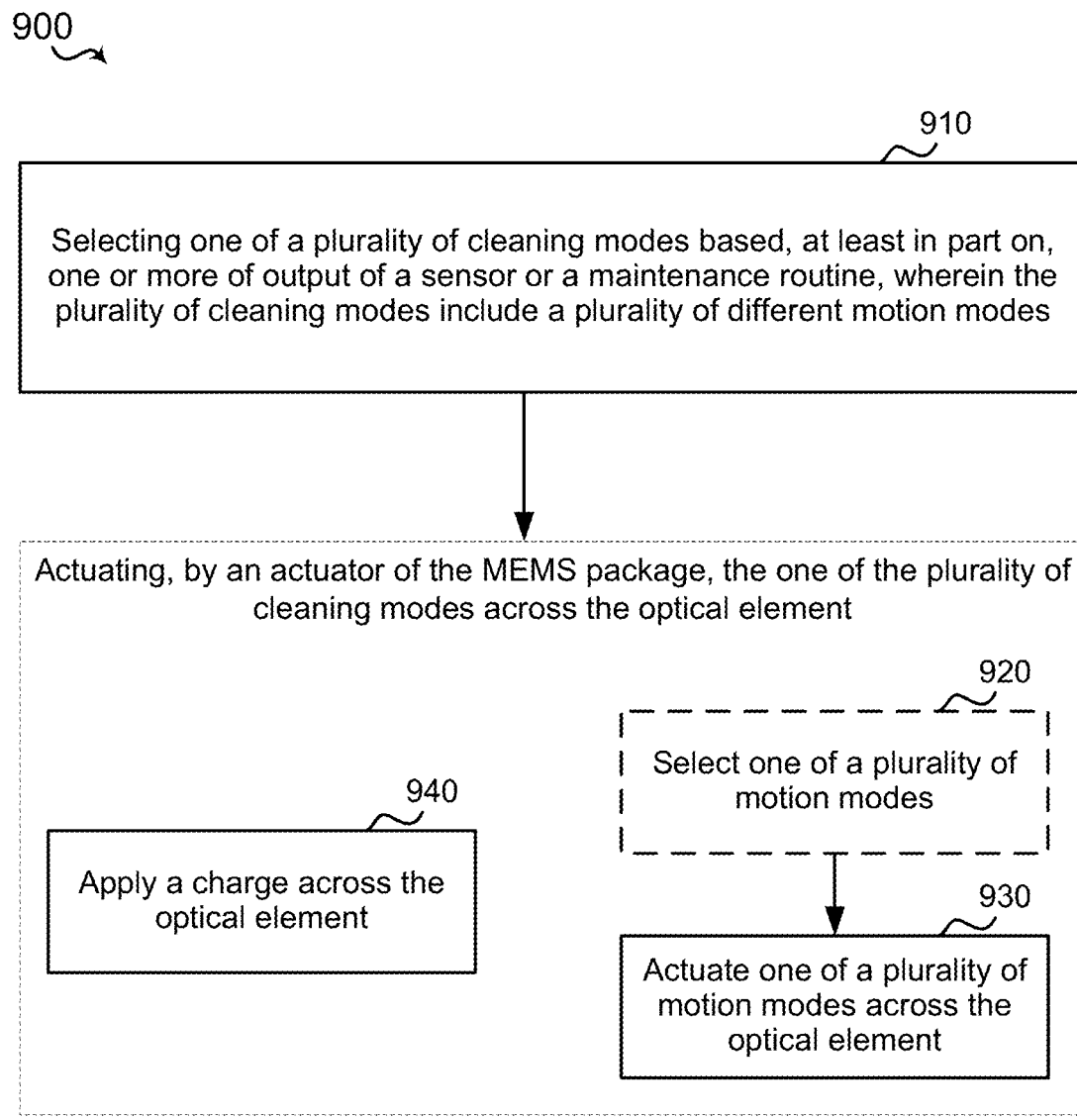
FIG. 9 is a process flow diagram of an example method of removing particulate accumulation from an optical element of a MEMS package according to the present disclosure.

Referring to FIG. 9, for example, a method 900 for removing particulate matter from a MEMS package optical element is disclosed. The method 900 may be implemented to dislodge particulate matter from the surface of an optical element (e.g., optical element 150) of a MEMS package (e.g., MEMS package 110).

For example, at block 910, the method 900 may include selecting one of a plurality of cleaning modes based, at least in part on, one or more of output of a sensor or a maintenance routine, wherein the plurality of cleaning modes include a plurality of different motion modes. For instance, in an implementation, the MEMS package 110 and/or processing circuitry 180 may execute the cleaning mode selection component 182 to select a cleaning mode. The cleaning mode may include one or more of applying a charge to the optical element, e.g., a fixed or alternating current or both; and/or actuating one or a combination of motion modes to dislodge accumulated particulate matter, e.g., motion modes 135, 137, and 139.

For example, the MEMS package 110 may receive feedback from a sensor 160 indicating that the optical element 150 is operating with a motion frequency that lies outside of a range of acceptable operating frequencies, or below a threshold. The MEMS package 110, and/or processing circuitry 180 may execute cleaning motion selection component 182 and/or accumulation determining component 186 to select a motion mode based on feedback from a sensor 160. The sensor 160 may detect or identify a motion of the optical element 150. The information may be electrically communicated to the processing circuitry 180, which may execute sensor-based selection component 186 to determine a parameter from the electrical signal/feedback that indicates a change in the mass of the optical element 150 due to particulate accumulation on the optical element 150. The parameter may include a difference between the operating frequency of the optical element 150 and an expected operating frequency, or a change in mass of the optical element 150 attributable to the accumulation of particulate matter. The cleaning mode selection component 182 may then select one or more of applying a charge across the optical element 150 or actuating one of the plurality of the motion modes 135, 137, and 139 based on a comparison of the determined parameter to an expected value for the operating frequency. The expected operating frequency may be determined during testing, design, and/or construction of the MEMS package 110. One or more cleaning modes suited to removing particulate from the optical element 150 may also be determined prior to use of the MEMS package and may be stored in association with sensor feedback indicating mass or operating frequency change. The MEMS package 110 may select the one or more predetermined cleaning modes, or may select cleaning modes at random. In another alternative or additional implementation, the MEMS package 110 may receive feedback from the sensor 160 indicating that the magnitude of a charge on the surface of the optical element 150 has changed due to particulate accumulation, and may lie outside of an acceptable range or satisfies a threshold magnitude. The sensor 160 may detect or identify a motion of the optical element 150, for a given driving input provided by the actuator 130, and may electrically communicate this information to the sensor-based selection component 186. The sensor-based selection component 186 may calculate a parameter or value indicating change between the current charge on the surface of the optical element 150 and an expected charge based on the feedback of the sensor 160. A cleaning mode including one or more of applying a charge to the optical element 150 or actuating a motion mode, e.g., motion modes 135, 137, and 139, may be selected by the cleaning mode selection component 182 based on the parameter. The expected charge may be predetermined during design, testing, or construction of the MEMS package 110. At the same time, one or more cleaning modes suited to removing particulate accumulation in response to the detection of a change in charge across the surface of the optical element 150 may be determined. These cleaning modes may be stored in association with sensor feedback indicating a change in charge.

In some implementations, the cleaning mode selection component 182 may select one or more cleaning modes based upon the receipt of an indication that scanned images do not meet a quality threshold. An external device implementing the MEMS package 110 to produce images, may evaluate and analyze scanned images. If the image quality does not satisfy a quality threshold, then the external device may signal to the MEMS package 110 that the optical element 150 should be cleaned.

In some complimentary or alternative cases, the processing circuitry 180 executing cleaning mode selection component 182 and/or routine-based selection component 188 may select a cleaning mode, e.g., applying a charge to the optical element 150 and/or actuating a motion mode, e.g., motion modes 135, 137, and 139, during start or shutdown of the MEMS package 110. The selected cleaning mode may be electrically communicated to the actuator 130 and/or voltage source 120. Cleaning modes may be executed during one or both of startup and shut down of the MEMS package 110.

In some other alternative or additional implementations, the MEMS package 110 may select one or more cleaning modes based on a schedule or routine. The cleaning mode selection component 182 and/or routine-based selection component 188 may determine that a predetermined interval of time has lapsed or that particulate matter removal is scheduled to occur. For example, the routine-based selection component 188 may determine that the time matches a time scheduled for particulate matter removal. The routine-based selection component 188 may also determine that a predetermined amount of time has lapsed since the last particulate matter removal technique was executed. The routine-based selection component 188 may signal the cleaning mode selection component 182 to select one or more of applying a charge to the optical element 150 or actuating a motion mode and inform the actuator 130.

In an implementation, in block 940, the method 900 includes applying, by a power source of the MEMS package, an electrical charge to the optical element. For instance, in an implementation, the MEMS package 110 and/or voltage source 120 may execute the charge applying component 122 to enable the flow of electrical current through the electrical traces (e.g., electrical traces 144) of the MEMS package 110 and the optical element 150. The voltage source 120 may connect to electrical contacts 604 (e.g., pads), disposed on opposing sides of the optical element 150 of the MEMS package 110, which connect to traces 144 within the optical element 150, configured to apply the charge across the package. In some implementations, the determination of whether to apply fixed charge, AC, or both may depend on whether particulate removal is initiated in response to sensor feedback or as part of a maintenance routine. If the cleaning mode is selected as part of a maintenance routine, then the applied charge may be fixed. If the cleaning mode is selected in response to sensor feedback, the charge may be random or may be predetermined and associated with a specific type of sensor feedback. Optionally or in addition, at block 920, the method 900 includes selecting one of a plurality of motion modes. For instance, in an implementation, the MEMS package 110 and/or processing circuitry 180 may execute the cleaning mode selection component 182 and/or any of its subcomponents (e.g., subcomponents 186, 188) to select a motion mode, e.g., motion modes 135, 137, and 139, for execution. The motion mode may be selected manually by a user, automatically according to a predetermined schedule, or in response to the occurrence of a trigger condition such as feedback from a sensor satisfying a threshold.

Additionally, at block 930, the method 900 includes actuating, by an actuator of the MEMS package, one of a plurality of cleaning modes across the optical element. For instance, in an implementation, the MEMS package 110 and/or actuator 130 may execute the cleaning mode selection component 182 to trigger the actuating component 132 to drive one of the plurality of motion modes through the MEMS package 110 to the optical element 150, and/or to trigger voltage source 120 to apply a charge across the optical element. The actuating may include propagating waves of a frequency and a type associated with the one of the plurality of the motions modes across the optical element 150. The motion mode may be determined prior to the first use of the MEMS package and stored in association with the scheduled event. The predetermined motion mode may be actuated during startup or shutdown of the MEMS package 110, or may be any of the selected cleaning motion modes triggered based on detection of accumulated particulate mass, changes in operating frequency, changes in charge on the optical element 150. Further, the actuator 130 may initiate motion of the optical element 150 according to a schedule or at predetermined time intervals e.g., a maintenance routine, upon receiving a signal from the cleaning mode selection component 182. Additionally or in the alternative, for instance, the MEMS package 110 and/or voltage source 120 may execute the charge applying component 122 to enable the flow of electrical current through the electrical traces (e.g., electrical traces 144) of the MEMS package 110 and the optical element 150 to repel particular matter, e.g., by applying a fixed charge, an alternating charge, or a combination of both.

In some cases, block 930 and block 940 may execute simultaneously or in series.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details to provide an understanding of the described techniques. These techniques, however, may be practiced without these specific details. Sometimes, well-known structures and apparatuses are shown in block diagram form to avoid obscuring the concepts of the described examples.

Information and signals may be represented using any of a variety of technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The illustrative blocks and components described to process circuitry of the disclosure herein may be implemented internally or performed by an external device with a specially-programmed device, such as but not limited to a processor, a digital signal processor (DSP), an ASIC, a FPGA or other programmable logic device, a discrete gate or transistor logic, a discrete hardware component, or any combination thereof designed to perform the functions described. A specially-programmed processor may be a microprocessor, but the processor may be any conventional processor, controller, microcontroller, or state machine. A specially-programmed processor may also be implemented as a combination of computing devices, e.g., a combination of a DSP and a microprocessor, multiple microprocessors, one or more microprocessors with a DSP core, or any other such configuration.

The functions described may be implemented in hardware, software executed by a processor, firmware, or any combination thereof. If implemented in software executed by a processor, the functions may be stored on or transmitted over as one or more instructions. Other examples and implementations are within the scope and spirit of the disclosure and appended claims. For example, due to the nature of software, functions described above can be implemented using software executed by a specially programmed processor, hardware, firmware, hardwiring, or combinations of these. Features implementing functions may also be physically at various positions, including being distributed so portions of functions are implemented at different physical locations. Also, as used herein, including in the claims, "or" as used in a list of items prefaced by "at least one of" indicates a disjunctive list so, for example, a list of "at least one of A, B, or C" means A or B or C or AB or AC or BC or ABC (i.e., A and B and C).

The previous description of the disclosure is provided to enable a person skilled in the art to make or use the disclosure. Various modifications to the disclosure will be readily apparent to those skilled in the art, and the common principles defined may be applied to other variations without departing from the spirit or scope of the disclosure. Although elements of the described implementations and/or embodiments may be described or claimed in the singular, the plural is contemplated unless limitation to the singular is explicitly stated. And all or a portion of any implementation and/or embodiment may be utilized with all or a portion of any other implementation and/or embodiment, unless stated otherwise. The disclosure is not to be limited to the examples and designs described but is to be accorded the widest scope consistent with the principles and novel features disclosed.

What is claimed is:

1. A method of operating a micro electromechanical systems (MEMS) package, comprising:
   selecting, by a processor, one of a plurality of cleaning modes for cleaning an optical element of the MEMS package based, at least in part on, one or more of output of a sensor or a maintenance routine, wherein the plurality of cleaning modes include a plurality of different motion modes for applying a motion across the optical element; and actuating, by an actuator, the one of the plurality of cleaning modes across the optical element.

2. The method of claim 1, wherein actuating the one of the plurality of cleaning modes comprises applying at least one of the plurality of different motion modes and applying a charge to the optical element.

3. The method of claim 1, wherein the one of the plurality of motion modes is selected based on the one or more of the output of the sensor, the maintenance routine, or an indication that images produced by the MEMS package do not meet a quality threshold.

4. The method of claim 1, wherein selecting the one of the plurality of cleaning modes based on the output of one or more sensors comprises:

detecting, by a sensor of the MEMS package, a motion of the optical element;

determining a parameter associated with particulate accumulation on the optical element based on the detected motion; and selecting the one of the plurality of cleaning modes based on the determined parameter associated with the particulate accumulation on the optical element.

5. The method of claim 4, wherein the parameter associated with the particulate accumulation comprises a charge on a surface of the optical element or a frequency of the detected motion of the optical element.

6. The method of claim 1, wherein actuating the one of the plurality of cleaning modes comprises propagating waves of a frequency and a type associated with the one of the plurality of the motion modes across the optical element.

7. The method of claim 1, wherein selecting the one or the plurality of cleaning modes based on the maintenance routine comprises selecting the one or the plurality of cleaning modes in response to a startup or a shutdown of operation of the MEMS package.

8. The method of claim 1, wherein selecting the one or the plurality of cleaning modes based on the maintenance routine comprises:

determining whether a threshold interval of time has passed; and selecting the one or the plurality of cleaning modes in response to determining that the threshold time interval has passed.

9. A micro electromechanical systems (MEMS) package, comprising:

a power source;
an actuator;
electrical traces;
one or more sensors;
an optical element operatively connected to the one or more sensors, power source and the actuator by the electrical traces; and
processing circuitry operatively connected to the one or more sensors, power source, the actuator, and the optical element by the electrical traces and configured to:

select one of a plurality of cleaning modes based, at least in part on, one or more of output of a sensor or a maintenance routine, wherein the plurality of cleaning modes include a plurality of different motion modes; and actuate the one of the plurality of cleaning modes across the optical element.

10. The MEMS package of claim 9, wherein the processing circuitry configured to actuate the one of the plurality of cleaning modes is configured to apply at least one of the plurality of different motion modes to the optical element and apply a charge to the optical element.

11. The MEMS package of claim 9, wherein the one or more sensors comprise a piezoresistive element.

12. The MEMS package of claim 9, wherein the one or more sensors are configured to:

detect motion of the optical element;

wherein the processing circuitry is configured to determine a parameter associated with particulate accumulation on the optical element based on the detected motion, and select the one of the plurality of cleaning modes based on the determined parameter associated with the optical element.

13. The MEMS package of claim 12, wherein the parameter associated with the particulate accumulation comprises a charge on a surface of the optical element or a frequency of the detected motion of the optical element.

14. The MEMS package of claim 9, wherein the power source includes electrical contacts in communication with the optical element and configured to apply a charge to the optical element.

15. The MEMS package of claim 9, wherein the processing circuitry is further configured to select the one of the plurality of cleaning modes based on the maintenance routine in response to a startup or a shutdown of operation of the MEMS package.

16. The MEMS package of claim 9, wherein the processing circuitry is further configured to select the one of the plurality of cleaning modes based on the maintenance routine by:

determining whether a threshold interval of time has passed; and selecting the one of the plurality of cleaning modes in response to determining that the threshold time interval has passed.

17. The MEMS package of claim 9, wherein the actuator is configured to actuate one or a plurality of different motion modes by propagating waves of a frequency and a type associated with the one of the plurality of the motions modes across the optical element.

18. The MEMS package of claim 9, wherein the actuator is electrostatic, electromagnetic, or piezoelectric and the electrical traces are integrated into the optical element.

19. The MEMS package of claim 9, wherein the one or more sensors comprise piezoresistive elements disposed between the power source and the optical element.

20. The MEMS package of claim 9, wherein the MEMS package is at least partially constructed from a silicon substrate.

* * * * *